United States Patent
Yuan

(10) Patent No.: US 11,707,004 B2
(45) Date of Patent: Jul. 18, 2023

(54) PHASE-CHANGE MEMORY

(71) Applicant: Yangtze Memory Technologies Co., Ltd., Wuhan (CN)

(72) Inventor: Gang Yuan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 159 days.

(21) Appl. No.: 16/849,236

(22) Filed: Apr. 15, 2020

(65) Prior Publication Data

US 2021/0226123 A1 Jul. 22, 2021

Related U.S. Application Data

(63) Continuation of application No. PCT/CN2020/072353, filed on Jan. 16, 2020.

(51) Int. Cl.
*H01L 45/00* (2006.01)
*H10N 70/00* (2023.01)
*H10N 70/20* (2023.01)

(52) U.S. Cl.
CPC ....... *H10N 70/8613* (2023.02); *H10N 70/231* (2023.02); *H10N 70/841* (2023.02)

(58) Field of Classification Search
CPC ...................................................... H01L 45/06
See application file for complete search history.

(56) References Cited

U.S. PATENT DOCUMENTS

| 7,473,921 B2 | 1/2009 | Lam et al. |
| 2007/0235784 A1 | 10/2007 | Krusin-Elbaum et al. |
| 2008/0044632 A1* | 2/2008 | Liu ........... H10N 70/826 428/689 |
| 2008/0106929 A1 | 5/2008 | Meyer et al. |
| 2008/0210923 A1* | 9/2008 | Sato ........... H01L 45/1233 438/54 |
| 2012/0281466 A1* | 11/2012 | Liu ........... H01L 45/148 257/E47.001 |
| 2012/0307546 A1 | 12/2012 | Perniola et al. |
| 2020/0395537 A1* | 12/2020 | Ok ........... H01L 45/144 |

FOREIGN PATENT DOCUMENTS

| CN | 1971960 A | 5/2007 |
| CN | 101131989 A | 2/2008 |
| CN | 101512788 A | 8/2009 |
| EP | 1688958 A1 | 8/2006 |
| WO | 2008020961 A1 | 2/2008 |

* cited by examiner

*Primary Examiner* — Moazzam Hossain
*Assistant Examiner* — Hajar Kolahdouzan
(74) *Attorney, Agent, or Firm* — Anova Law Group, PLLC

(57) ABSTRACT

A phase-change memory (PCM) device includes a first electrode, a second electrode, a memory layer, and a heater. The memory layer includes a phase-change material and is electrically coupled between the first electrode and the second electrode. The heater is arranged near the memory layer and is configured to heat a programming region of the memory layer in response to an electric current that passes through the heater. The heater is coupled to a power source via an electric current path that does not pass through the memory layer.

17 Claims, 4 Drawing Sheets

PHASE-CHANGE MEMORY

CROSS-REFERENCE TO RELATED APPLICATION

This application is a continuation of International Application No. PCT/CN2020/072353, filed on Jan. 16, 2020, the entire content of which is incorporated herein by reference.

FIELD OF THE TECHNOLOGY

This application relates to the field of nonvolatile memory and, more specifically, to methods and apparatus of phase-change memory (PCM).

BACKGROUND OF THE DISCLOSURE

Nonvolatile memory is widely used in various electronic devices such as smart phones, smart watches, digital cameras, USB thumb-drives, etc. In addition, nonvolatile memory is also an emerging solid-state replacement for the hard disk drives. Phase-change memory (PCM) is a type of promising nonvolatile memory, which exploits the large resistivity difference of a phase-change material between different states, such as a crystalline state and an amorphous state. For example, a phase-change material has a higher electrical resistivity in the amorphous phase than in the crystalline phase.

During the operation of a PCM device, a current pulse with a narrow pulse width and a large magnitude is injected into a region of the phase-change material. The pulsed current rapidly melts the phase-change material which then re-solidifies. The process causes the material to change from the crystalline state to the amorphous state, i.e., from low resistance state to high resistance state. The process may be used as a writing step for the PCM device. If the high resistance represents data "0", writing "0" means changing the material from the low-resistance crystalline state to the high-resistance amorphous state. On the other hand, when the region of the amorphous material is applied with a current with moderate magnitude and a moderate pulse width, the other writing step happens and the material changes from the amorphous state to the crystalline state, i.e., from high resistance state to low resistance state. If the low resistance represents data "1", writing "1" means changing the material from the high-resistance amorphous state to the low-resistance crystalline state. In applications, switching between "0" and "1" happens many times at a PCM device.

The switching process between the amorphous phase and the crystalline phase is caused by Joule heating along a current path in a region of the phase-change material. For example, when a current pulse is large enough, the heat generated may melt or crystallize the material along a section of the current path. Mass density of a phase-change material usually increases upon crystallization, and hence stress builds up in the phase-change material after repeated cycling over time. The accumulated stress along with the change of mass density may cause void formation, especially in an interface region between an electrode and the phase-change material. Once voids block the current path of a PCM device, a current can no longer be applied to read or write information. The path is blocked and the device is damaged permanently. Thus, void formation affects the reliability of PCM devices.

Therefore, there exists a need to improve the reliability of PCM devices by reducing the void formation and reducing the damage caused by the void formation. The disclosed devices are directed to solving the problems and other problems.

SUMMARY

In one aspect, the present disclosure provides a phase-change memory (PCM) device includes a first electrode, a second electrode, a memory layer, and a heater. The memory layer includes a phase-change material and is electrically coupled between the first electrode and the second electrode. The heater is arranged near the memory layer and is configured to heat a programming region of the memory layer in response to an electric current that passes through the heater. The heater is coupled to a power source via an electric current path that does not pass through the memory layer.

Other aspects of the present disclosure can be understood by those skilled in the art in light of the description, the claims, and the drawings of the present disclosure.

DESCRIPTION OF EMBODIMENTS

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all the embodiments of the present disclosure. Other embodiments obtained by a person skilled in the art based on the embodiments of the present disclosure without creative efforts shall fall within the protection scope of the present disclosure.

Figure 1A:
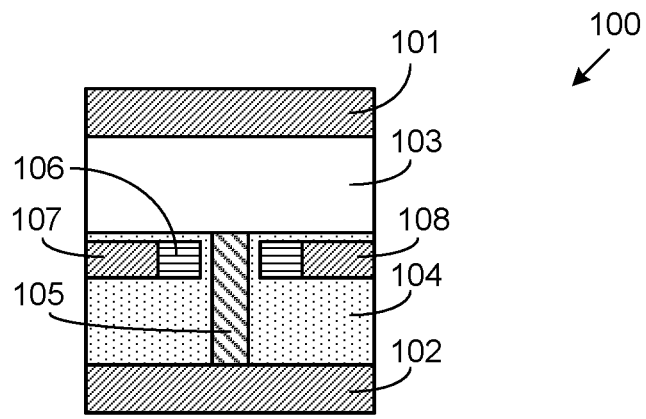
FIGS. 1A, 1B, and 1C illustrate schematic structural diagrams of a phase-change memory (PCM) device according to an embodiment of the present disclosure.
Figure 1B:
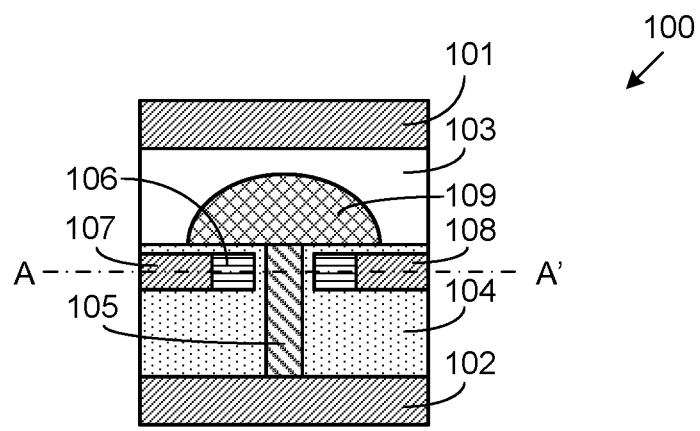
Figure 1C:
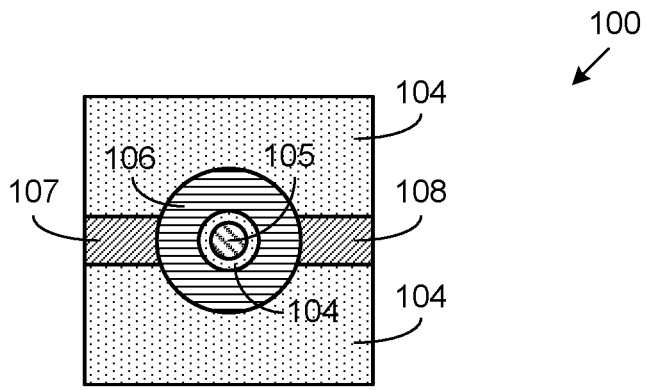

FIGS. 1A-1C schematically show the structure of an example phase-change memory (PCM) device 100 consistent with embodiments of the present disclosure. FIGS. 1A and 1B are cross-sectional views of the PCM device 100 and FIG. 1C is another cross-sectional view of the PCM device 100 along a line AA' in FIG. 1B. As shown in FIGS. 1A-1C, the PCM device 100 includes a top electrode 101 and a bottom electrode 102. The PCM device 100 further includes a memory layer 103 and an isolation layer 104 sandwiched between the top electrode 101 and the bottom electrode 102. In the example shown in FIGS. 1A and 1B, the isolation layer 104 is arranged between the memory layer 103 and the bottom electrode 102. In some other embodiments, the isolation layer 104 can be arranged between the top electrode 101 and the memory layer 103.

The PCM device 100 further includes a conductor layer 105, a heater 106, and electrodes 107 and 108. The conductor layer 105 and the heater 106 are embedded in the isolation layer 104. The electrodes 107 and 108 are at least partially buried in the isolation layer 104. The electrodes 107 and 108 are electrically coupled to the heater 106 and configured to provide electric current to the heater 106. In the example shown in FIGS. 1A and 1B, the conductor layer 105 is electrically coupled between the memory layer 103 and the bottom electrode 102. In some other embodiments in which the isolation layer 104 is arranged between the top electrode 101 and the memory layer 103, the conductor layer 105 can be electrically coupled between the top electrode 101 and the memory layer 103.

The memory layer 103 can include a phase-change material such as one or more of Ge—Sb—Te (GST) based materials. One example of the phase-change materials is $Ge_2Sb_2Te_5$. The phase-change material can have a large resistivity contrast between different phases, such as the crystalline and amorphous phases. For example, the phase-change material can exhibit a relatively low electrical resistivity in the crystalline phase, but show a relatively high electrical resistivity in the amorphous phase, and the electrical resistivity of the phase-change material in the amorphous phase can be hundreds to thousands of times higher than that in the crystalline phase. The phase-change material can switch between the different phases when being heated. Consistent with the disclosure, the heater 106 can be used to heat at least a portion of the memory layer 103 to change the phase of the at least a portion of the memory layer 103.

In this disclosure, the portion of the memory layer 103 that can be heated by the heater 106 to change phase is also referred to as a programming region of the memory layer 103, which is indicated by reference numeral 109 in FIG. 1B. The programming region 109 can be adjacent to and electrically coupled with the conductor layer 105. The phase of the programming region 109 may be changed by applying an electric current, such as an electric current pulse, to the heater 106. In the example shown in FIG. 1B, the programming region 109 has a dome shape. In some other embodiments, the programming region 109 can have another shape. The shape of the programming region 109 can depend on various factors, such as the configuration and/or properties of the memory layer 103, and/or the shape and/or arrangement of the heater 106.

The heater 106 may be made of an appropriate resistive material having a proper resistivity, such as a metallic material, a ceramic material, or a composite material. For example, the heater 106 may be made of nichrome that includes 80% nickel and 20% chromium. Depending on the material forming the heater 106, the heater 106 can include a metallic heating element, a ceramic heating element, or a composite heating element.

In the example shown in FIGS. 1A-1C, the heater 106 includes a ring-shaped heating element surrounding an end portion of the conductor layer 105. In some other embodiments, the heater 106 may partially surround the end portion of the conductor layer 105. Further, the heater 106 may not necessarily be in a ring shape or a partial ring shape. In some embodiments, the heater 106 can have another shape that can at least partially surround the end portion of the conductor layer 105, such as a square or partial square shape, a rectangular or partial rectangular shape, or an oval or partial oval shape, or a shape that includes a combination of two or more of the above example shapes. In some embodiments, the heater 106 does not surround or partially surround the end portion of the conductor layer 105. For example, the heater 106 can be arranged near the end portion of the conductor layer 105, as long as a portion of the memory layer 103 can be heated by the heater 106 to change phase.

In some embodiments, the heater 106 and the end portion of the conductor layer 105 are disposed near the memory layer 103, e.g., near the programming region 109. The heater 106 may be buried in the isolation layer 104 and electrically isolated from the top electrode 101, the bottom electrode 102, the conductor layer 105, and/or the memory layer 103 by the isolation layer 104. A part of the programming region 109 can physically contact a surface of the end portion of the conductor layer 105. The heater 106 can be separated from the programming region 109 and the conductor layer 105 by a thin part of the isolation layer 104.

As shown in FIGS. 1A-1C, the electrodes 107 and 108 are arranged at two opposite sides of the heater 106 and at positions between the top and bottom electrodes 101 and 102. The electrodes 107 and 108 are electrically coupled to the heater 106 and provide an electric current to the heater 106. In some embodiments, when the electric current passes through the heater 106, the heater 106 may generate heat via Joule heating and heat the programming region 109 by, e.g., heat transfer through a thin part of the isolation layer 104. Thus, when an electric current is applied to the heater 106 via the electrodes 107 and 108, the temperature of the programming region 109 may rise.

In some embodiments, the top electrode 101, the bottom electrode 102, the electrode 107, and the electrode 108 may each have a sheet-like structure and include one or more low-resistance materials, such as metal (e.g., copper) and/or semiconductor material (e.g., polysilicon). In some embodiments, the electrodes 107 and 108 may each have a stripe-like structure.

The isolation layer 104 may include an electrically insulating material such as silicon dioxide or silicon nitride.

The conductor layer 105 may include a same material as or a different material from the top electrode 101 and/or the bottom electrode 102. In some embodiments, the conductor layer 105 may include one or more low-resistance materials, such as metal (e.g., copper) and/or semiconductor material (e.g., polysilicon such as n-type polycrystalline silicon).

In the example shown in FIGS. 1A-1C, the conductor layer 105 has a shape of a circular pillar. A cross-section of the conductor layer 105 may be smaller or much smaller than a cross-section of the memory layer 103 or the bottom electrode 102 in a plane parallel to the memory layer 103 or the bottom electrode 102. In some other embodiments, the conductor layer 105 may have an oval pillar shape, a rectangular pillar shape, or a square pillar shape. In some embodiments, a thin layer can be formed between the conductor layer 105 and the memory layer 103. The thin layer can, for example, improve the quality of an interface between the conductor layer 105 and the memory layer 103. The thin layer may include, e.g., TiN.

An example operation of the PCM device 100 is described below. Assume that the memory layer 103 is initially in the crystalline state with a low resistance. When a large electric current, e.g., a large electric current pulse, is applied to the heater 106 for a short time period, the programming region 109 is heated to a temperature above the melting temperature of the phase-change material. After the phase-change material in the programming region 109 is melted and then cooled down, the programming region 109 solidifies but into an amorphous state. That is, this heating-cooling process causes the programming region 109 to change from the crystalline state to the amorphous state. When a moderate electric current, e.g., a moderate electric current pulse, is applied to the heater 106 for a moderate time period, the programming region 109 is heated again to a temperature above the crystallization temperature of the phase-change material but lower than the melting temperature of the phase-change material. At this temperature, the programming region 109 may be recrystallized. That is, this heating process causes the programming region 109 to return to the crystalline state.

The programming region 109 and the remaining part of the memory layer 103 are electrically coupled to each other, and the resistance of the remaining part of the memory layer 103 may remain unchanged during the operation of the PCM device 100. As such, the change of resistance of the PCM device 100 can be determined by the change of resistance of the programming region 109, i.e., by the phase change of the programming region 109. Thus, the resistance of the PCM device 100 may be used to detect whether the programming region 109 is in the crystalline or the amorphous state and the phase change may be used for data storage.

According to the present disclosure, the heater 106 is powered via the electrodes 107 and 108. Therefore, even if voids are formed in the programming region 109 as a result of repeated expanding and shrinking of the programming region 109, the operation of the heater 106 is not affected because the heater 106 does not rely on the programming region 109 to receive an electric current.

In some embodiments, the heater 106 can be used as a sole heater for heating the programming region 109. In some other embodiments, the conductor layer 105 can also be formed of a resistive material and also function as a heater. During writing, an electric current can be applied to the conductor layer 105 via the top and bottom electrodes 101 and 102 to generate Joule heat for heating the programming region 109. In these embodiments, the conductor layer 105 and the heater 106 can heat the programming region 109 together. Alternatively, the conductor layer 105 can function as a main heater and the heater 106 can function as an auxiliary heater. That is, during normal operation, the conductor layer 105 can be used to heat (and hence program) the programming region 109. When voids are formed in the programming region 109 that results in an open circuit or abnormally large resistance in the electric current path that passes through the conductor layer 105, the conductor layer 105 can no longer work. In this situation, the heater 106 can be used to repair the programming region 109 by heating the programming region 109 in one or more cycles to eliminate the voids such that the electric current path that passes through the conductor layer 105 can be re-established.

Figure 2:
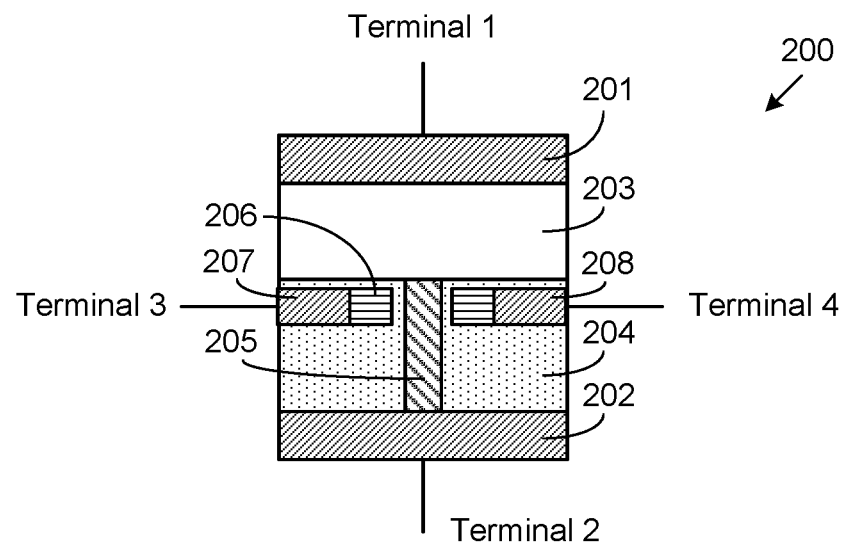
FIG. 2 illustrates a schematic structural diagram of another PCM device according to another embodiment of the present disclosure.

FIG. 2 illustrates a schematic structural diagram of another example PCM device 200 in a cross-sectional view, consistent with embodiments of the present disclosure. The PCM device 200 is similar to the PCM device 100 shown in FIGS. 1A-1C, except that the PCM device 200 further includes a plurality of terminals. All of the structural and material features and variations of the embodiments described above in connection with FIGS. 1A-1C may be applied to the PCM device 200. As shown in FIG. 2, the PCM device 200 includes a top electrode 201, a bottom electrode 202, a memory layer 203, an isolation layer 204, a conductor layer 205, a heater 206, and electrodes 207 and 208 coupled to the heater 206. The heater 206 and the conductor layer 205 are arranged in the isolation layer 204 that includes an electrically insulating material. The top electrode 201, the bottom electrode 202, the electrode 207, and the electrode 208 may each have a sheet-like structure and include one or more low-resistance materials, such as metal (e.g., copper) and/or semiconductor material (e.g., polysilicon). The conductor layer 205 may include a same material as or a different material from the top electrode 201 and/or the bottom electrode 202. In some embodiments, the conductor layer 205 may include one or more low-resistance materials, such as metal (e.g., copper) and/or semiconductor material (e.g., polysilicon such as n-type polycrystalline silicon).

Similar to the memory layer 103 of the PCM device 100, the memory layer 203 can include a phase-change material such as one or more of the GST-based materials. The phase-change material can have a large resistivity contrast between different phases, such as the crystalline and amorphous phases. The phase-change material can switch between the different phases when being heated. Consistent with the disclosure, the heater 206 can be used to heat and change the phase of a programming region (not shown) of the memory layer 203. The programming region of the memory layer 203 can have a dome or another shape and be adjacent to and electrically coupled with the conductor layer 205.

Similar to the heater 106 of the PCM device 100, the heater 206 may be made of a resistive material having a proper resistivity and include a ring-shaped heating element surrounding an end portion of the conductor layer 205. In some other embodiments, the heater 206 may have another shape and completely or partially surround or be close to the end portion of the conductor layer 205.

In some embodiments, the heater 206 and the end portion of the conductor layer 205 are disposed near the memory layer 203, e.g., near the programming region of the memory layer 203. The heater 206 may be buried in the isolation layer 204 and electrically isolated from the top electrode 201, the bottom electrode 202, the conductor layer 205, and/or the memory layer 203 by the isolation layer 204. A part of the programming region of the memory layer 203 can physically contact a surface of the end portion of the conductor layer 205.

Similar to the configuration of the PCM device 100, the electrodes 207 and 208 are arranged at two opposite sides of the heater 206 and at positions between the top and bottom electrodes 201 and 202. The electrodes 207 and 208 are electrically coupled to the heater 206 and provide an electric current to the heater 206. When an electric current is applied to the heater 206 via the electrodes 207 and 208, the temperature of the programming region may rise.

As shown in FIG. 2, the top and bottom electrodes 201 and 202 are electrically coupled to terminals 1 and 2, respectively, and the electrodes 207 and 208 are electrically coupled to terminals 3 and 4, respectively. Terminals 1, 2, 3, and 4 can form two electrically isolated current paths. One current path passes through the conductor layer 205 and the memory layer 203, and the other current path passes through the heater 206.

In one operation mode, the heater 206 is powered via terminals 3 and 4 to write data to the memory layer 203 by heating the programming region of the memory layer 203. For example, large or moderate current pulses can be supplied to the heater 206 to heat the programming region, so as to switch the phase of the programming region between the amorphous phase and the crystalline phase. The read process can be performed via terminals 1 and 2 by detecting the resistance of the memory layer 203. For example, a high resistance value may represent data "0", while a low resistance value may represent data "1". If the resistance value is abnormally high, it may indicate that the path that passes through the conductor layer 205 and the memory layer 203 is blocked. In this situation, the heater 206 may be used to repair the programming region by heating the programming region in one or more cycles. Recrystalizing or melting plus recrystalizing may occur during this process.

In some other embodiments, the conductor layer 205 can also be made of a resistive material similar to the heater 206. In these embodiments, another operation mode can be implemented. In this operation mode, the write process can be performed by heating the programming region using the conductor layer 205 as a main heater, while the heater 206 is used as an auxiliary heater for repairing the programming region. Thus, terminals 1 and 2 can be used in both the write and read processes, while terminals 3 and 4 are involved in the repair process. Via terminals 1 and 2, large or moderate current pulses may be applied to switch the phase of the programming region between the amorphous state and the crystalline state to write data to the programming region. The read process can be performed by detecting the resistance of the memory layer 203. If the resistance value is abnormally high, it may indicate that the current path that passes through the conductor layer 205 and the memory layer 203 is blocked. In this situation, the heater 206 may be powered via terminals 3 and 4 to repair the programming region by heating the programming region in one or more cycles. Recrystalizing or melting plus recrystalizing may occur during this process.

Figure 3:
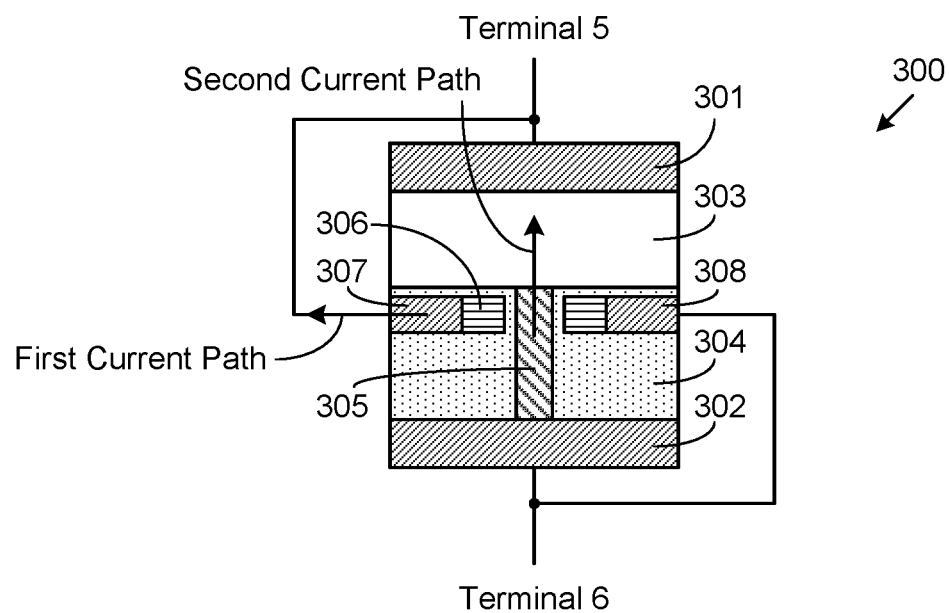
FIG. 3 illustrates a schematic structural diagram of another PCM device according to another embodiment of the present disclosure.

FIG. 3 illustrates a schematic structural diagram of another example PCM device 300 in a cross-sectional view, consistent with embodiments of the present disclosure. The PCM device 300 is similar to the PCM device 200 shown in FIG. 2, except that the PCM device 300 includes a different terminal configuration. All of the structural and material features and variations of the embodiments described above in connection with FIG. 2 may be applied to the PCM device 300. As shown in FIG. 3, the PCM device 300 includes a top electrode 301, a bottom electrode 302, a memory layer 303, an isolation layer 304, a conductor layer 305, a heater 306, and electrodes 307 and 308 coupled to the heater 306. In some embodiments, the top electrode 301, the bottom electrode 302, the memory layer 303, the isolation layer 304, the conductor layer 305, the heater 306, and the electrodes 307 and 308 of the PCM device 300 are the same as or similar to the top electrode 201, the bottom electrode 202, the memory layer 203, the isolation layer 204, the conductor layer 205, the heater 206, and the electrodes 207 and 208 of the PCM device 200, respectively.

For example, the memory layer 303 can include a phase-change material such as one or more of the GST-based materials. The phase-change material can have a large resistivity contrast between different phases, such as the crystalline and amorphous phases. The phase-change material can switch between the different phases when being heated. The heater 306 can be used to heat and change the phase of a programming region (not shown) of memory layer 303. The programming region can have a dome or another shape and be adjacent to and electrically coupled with the conductor layer 305.

As shown in FIG. 3, the PCM device 300 has two terminals, terminals 5 and 6. The top electrode 301 and the electrode 307 are electrically coupled to terminal 5, and the bottom electrode 302 and the electrode 308 are electrically coupled to terminal 6. FIG. 3 also shows two separate current paths formed between terminals 5 and 6, i.e., a first current path passing through the heater 306, and a second current path passing through the conductor layer 305 and the memory layer 303. The arrows in FIG. 3 indicate example directions of the currents in the first and second current paths. In some other embodiments, the directions of the currents in the first and second current paths can be opposite to those indicated by the arrows in FIG. 3.

As shown in FIG. 3, the first and second current paths are electrically connected in parallel. Thus, the electrical resistance of the device 300 can equal the resistance of the parallelly connected first and second current paths. The resistance of the first current path can be fixed and determined by the heater 306. The programming region and the remaining part of the memory layer 303 are electrically coupled to each other, and the resistance of the remaining part of the memory layer 303 may remain unchanged during the operation of the PCM device 300. Hence, the change of resistance of the second path can depend on the change of resistance of the programming region, i.e., depending on the phase of the programming region. Thus, the resistance of the PCM device 300 between terminals 5 and 6 may be used to detect whether the programming region is in the crystalline or the amorphous state, and the phase change of the programming region may be used for data storage.

An example operation of the PCM device 300 is described below. Assume that the memory layer 303 is initially in the crystalline state with a low resistance. Also assume that the conductor layer 305 has a much lower resistance than the heater 306. As such, the resistance of the first current path is much larger than the resistance of the second current path initially due to the resistance of the heater 306. When a large electric current, e.g., a large electric current pulse, is applied to the device 300 for a short time period, the current is split into a first current passing through the heater 306 along the first current path and a second current passing through the conductor layer 305 and the memory layer 303 along the second current path. The first current passing through the heater 306 can generate heat in the heater 306 to heat the programming region of the memory layer 303. In some scenario, the second current may also generate some heat that may heat the programming region. Therefore, the programming region may be heated to a temperature above the melting temperature of the phase-change material. After the phase-change material in the programming region is melted and then cooled down, the programming region solidifies into an amorphous state. That is, this heating-cooling process causes the programming region to change from the crystalline state to the amorphous state.

When a moderate electric current, e.g., a moderate electric current pulse, is applied to device 300 for a moderate time period, the current is again split into a first current and a second current flowing along the first and second current paths, respectively. Similar to that in the above-described large-current process, the first current passing through the heater 306 can generate heat in the heater 306 and the second current may also generate heat. As such, the programming region is heated to a temperature above the crystallization temperature of the phase-change material but lower than the melting temperature of the phase-change material. At this temperature, the programming region may be recrystallized. That is, this heating process causes the programming region to return to the crystalline state.

According to the present disclosure, the heater 306 is powered via the first current path. Therefore, even if voids are formed along the second current path in the programming region, e.g., as a result of repeated expanding and shrinking of the programming region, the operation of the heater 306 is not affected because the heater 306 does not rely on the second current path to receive an electric current. Thus, the heater 306 may be used to heat the programming region to repair it.

In some other embodiments, the conductor layer 305 can also be formed of a resistive material and also function as a heater. This heater and the heater 306 can heat the programming region together when the second current path is conducting. When voids are formed in the programming region that results in an open circuit or abnormally large resistance in the second current path, the conductor layer 305 may no longer work. In this situation, the heater 306 can be used to repair the programming region by heating the programming region in one or more cycles to eliminate the voids such that the second current path can be re-established.

Figure 4A:
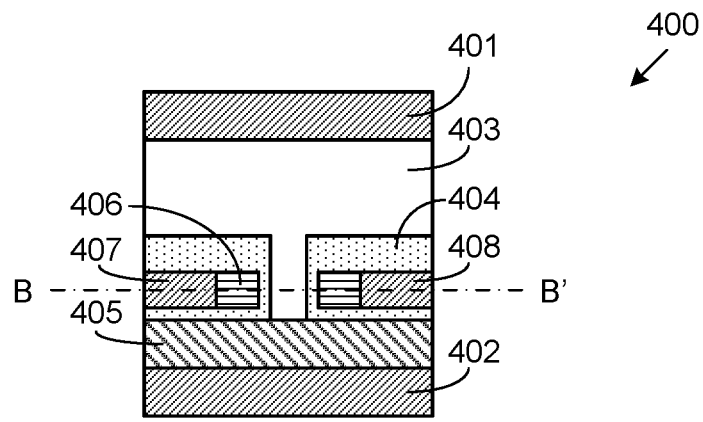
FIGS. 4A, 4B, and 4C illustrate schematic structural diagrams of another PCM device according to another embodiment of the present disclosure.
Figure 4B:
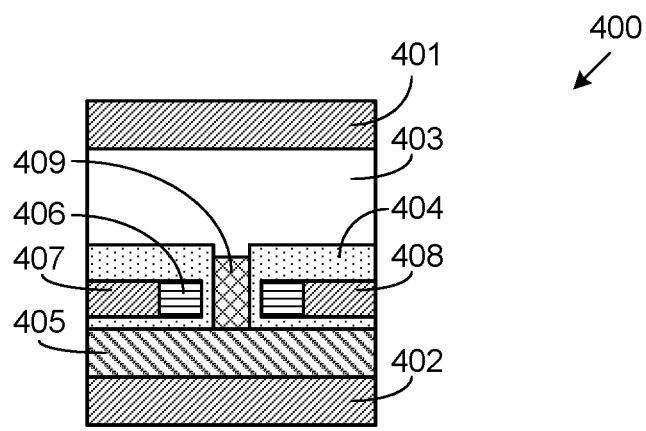
Figure 4C:
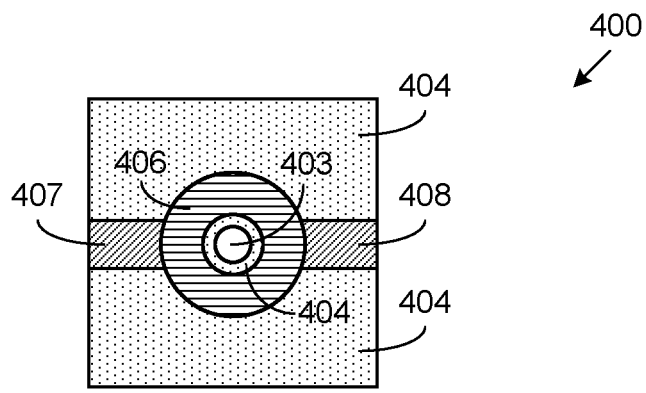

FIGS. 4A-4C schematically show the structure of another example PCM device 400 consistent with embodiments of the present disclosure. FIGS. 4A and 4B are cross-sectional views of the PCM device 400 and FIG. 4C is another cross-sectional view of the PCM device 400 along a line BB' in FIG. 4A. As shown in FIGS. 4A-4C, the PCM device 400 includes a top electrode 401, a bottom electrode 402, a memory layer 403, an isolation layer 404, a conductor layer 405, a heater 406, and electrodes 407 and 408 coupled to the heater 406. The isolation layer 404, including an electrically insulating material such as silicon dioxide or silicon nitride, is arranged between the memory layer 403 and the bottom electrode 402. The heater 406 is buried in the isolation layer 404, and the electrodes 407 and 408 are at least partially buried in the isolation layer 404. The top electrode 401, the bottom electrode 402, the electrode 407, and the electrode 408 may each have a sheet-like structure and include one or more low-resistance materials, such as metal (e.g., copper) and/or semiconductor material (e.g., polysilicon). In some embodiments, the electrodes 407 and 408 may each have a stripe-like structure. The conductor layer 405 may include a same material as or a different material from the top electrode 401 and/or the bottom electrode 402. In some embodiments, the conductor layer 405 may include one or more low-resistance materials, such as metal (e.g., copper) and/or semiconductor material (e.g., polysilicon such as n-type polycrystalline silicon). In the example shown in FIGS. 4A and 4B, the conductor layer 405 is electrically coupled between the memory layer 403 and the bottom electrode 402.

The memory layer 403 can include a phase-change material such as one or more of the GST-based materials. One example of the phase-change materials is $Ge_2Sb_2Te_5$. The phase-change material can have a large resistivity contrast between different phases, such as the crystalline and amorphous phases. For example, the phase-change material can exhibit a relatively low electrical resistivity in the crystalline phase, but show a relatively high electrical resistivity in the amorphous phase. The phase-change material can switch between the different phases when being heated. Consistent with the disclosure, the heater 406 can be used to heat a programming region 409 that is part of a protrusion portion of the memory layer 403 (as shown in FIG. 4B) to change the phase of the programming region 409.

In this disclosure, the programming region 409 can contact and be electrically coupled with the conductor layer 405. The phase of the programming region 409 may be changed by applying an electric current, such as an electric current pulse, to the heater 406. In the example shown in FIGS. 4A-4C, the protrusion portion of the memory layer 403 has a shape of a circular pillar. A cross-section of the protrusion portion may be smaller or much smaller than a cross-section of the memory layer 403 or the contact layer 405 in a plane parallel to the memory layer 403 or the contact layer 405. In some other embodiments, the protrusion portion of the memory layer 403 may have another shape, such as an oval pillar shape, a rectangular pillar shape, or a square pillar shape.

In this disclosure, the heater 406 may be made of a resistive material having a proper resistivity, such as a metallic material, a ceramic material, or a composite material. For example, the heater 406 may be made of nichrome that includes 80% nickel and 20% chromium. Depending on the material forming the heater 406, the heater 406 can include a metallic heating element, a ceramic heating element, or a composite heating element.

As shown in FIGS. 4A-4C, the heater 406 may include a ring-shaped heating element surrounding the programming region 409. In some other embodiments, the heater 406 may partially surround the programming region 409. Further, the heater 406 may not necessarily be in a ring shape or a partial ring shape. In some embodiments, the heater 406 can have another shape that can at least partially surround the programming region 409, such as a square or partial square shape, a rectangular or partial rectangular shape, or an oval or partial oval shape, or a shape that includes a combination of two or more of the above example shapes. In some embodiments, the heater 406 does not surround or partially surround the programming region 409. For example, the heater 406 can be arranged near the programming region 409, as long as the programming region 409 can be heated by the heater 406 to change phase.

In some embodiments, the heater 406 is disposed near the memory layer 403, e.g., near the programming region 409 and separated from the programming region 409 and the conductor layer 405 by a thin part of the isolation layer 404. The heater 406 may be electrically isolated from the top electrode 401, the bottom electrode 402, the conductor layer 405, and/or the memory layer 403.

As shown in FIGS. 4A-4C, the electrodes 407 and 408 are arranged at two opposite sides of the heater 406 and at positions between the top electrode 401 and the contact layer 405. The electrodes 407 and 408 are electrically coupled to the heater 406 and provide an electric current to the heater 406. In some embodiments, when an electric current passes through the heater 406, the heater 406 may generate heat via Joule heating and heat the programming region 409 by, e.g., heat transfer through a thin part of the isolation layer 404. Thus, when an electric current is applied to the heater 406 via the electrodes 407 and 408, the temperature of the programming region 409 may rise.

In some embodiments, a thin layer can be formed between the programming region 409 and the conductor layer 405 to, e.g., improve the quality of an interface between the programming region 409 and the conductor layer 405. The thin layer may include, e.g., TiN.

An example operation of the PCM device 400 is described below. Assume that the memory layer 403 is initially in the crystalline state with a low resistance. When a large electric current, e.g., a large electric current pulse, is applied to the heater 406 for a short time period, the programming region 409 is heated to a temperature above the melting temperature of the phase-change material. After the phase-change material in the programming region 409 is melted and then cooled down, the programming region 409 solidifies but into an amorphous state. That is, this heating-cooling process causes the programming region 409 to change from the crystalline state to the amorphous state. When a moderate electric current, e.g., a moderate electric current pulse, is applied to the heater 406 for a moderate time period, the programming region 409 is heated again to a temperature above the crystallization temperature of the phase-change material but lower than the melting temperature of the phase-change material. At this temperature, the programming region 409 may be recrystallized. That is, this heating process causes the programming region 409 to return to the crystalline state.

The programming region 409 and the remaining part of the memory layer 403 are electrically coupled to each other, and the resistance of the remaining part of the memory layer 403 may remain unchanged during the operation of the PCM device 400. As such, the change of resistance of the PCM device 400 can be determined by the change of resistance of the programming region 409, i.e., by the phase change of the programming region 409. Thus, the resistance of the PCM device 400 may be used to detect whether the programming region 409 is in the crystalline or the amorphous state and the phase change may be used for data storage.

According to the present disclosure, the heater 406 is powered via the electrodes 407 and 408. Therefore, even if voids are formed in the programming region 409 as a result of repeated expanding and shrinking of the programming region 409, the operation of the heater 406 is not affected because the heater 406 does not rely on the programming region 409 to receive an electric current.

Figure 5:
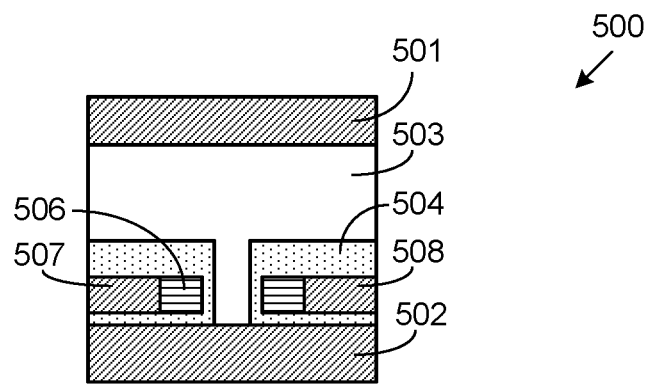
FIG. 5 illustrates a schematic structural diagram of another PCM device according to another embodiment of the present disclosure.

FIG. 5 schematically shows the structure of another example PCM device 500 in a cross-sectional view, consistent with embodiments of the present disclosure. The PCM device 500 is similar to the PCM device 400 shown in FIGS. 4A-4C, except that the PCM device 500 does not include a conductor layer like the conductor layer 405. That is, in the PCM device 500, the memory layer directly contacts the lower electrode. The structural and material features and variations of other parts of the PCM device 500 can be the same as or similar to those of the PCM device 400. As shown in FIG. 5, the PCM device 500 includes a top electrode 501, a bottom electrode 502, a memory layer 503, an isolation layer 504, a heater 506, and electrodes 507 and 508 coupled to the heater 506.

In some embodiments, the top electrode 501, the memory layer 503, the isolation layer 504, the heater 506, and the electrodes 507 and 508 of the PCM device 500 are the same as or similar to the top electrode 401, the memory layer 403, the isolation layer 404, the heater 406, and the electrodes 407 and 408 of the PCM device 400. In some embodiments, the PCM device 500 may be operated in a way same as or similar to that for the PCM device 400. In addition, the PCM device 500 may be repaired using the heater 506 in a way same as or similar to that for repairing the PCM device 400 using the heater 406.

For example, the isolation layer 504 is arranged between the memory layer 503 and the bottom electrode 502. The heater 506 is buried in the isolation layer 504. The memory layer 503 can include a phase-change material. The heater 506 can be used to heat a programming region (not labeled) that is part of a protrusion portion of the memory layer 503 to change the phase of the programming region. The protrusion portion of the memory layer 503 may have a shape of a circular pillar, an oval pillar, a rectangular pillar, or a square pillar. The heater 506 may have a ring shape or another shape and may at least partially surround the programming region of the memory layer 503. The heater 506 may also be disposed close to the programming region without surrounding the programming region. The electrodes 507 and 508 are arranged at two opposite sides of the heater 506 and at positions between the top and bottom electrodes 501 and 502. In some embodiments, a thin layer can be formed between the memory layer 503 and the bottom electrode 502 to, e.g., improve the quality of an interface between the memory layer 503 and the bottom electrode 502.

Figure 6A:
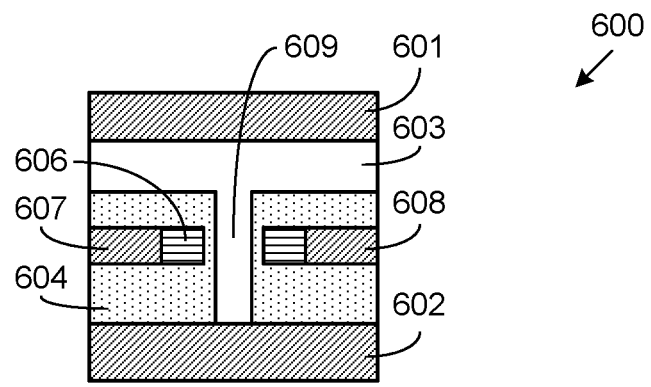
FIGS. 6A and 6B illustrate schematic structural diagrams of another PCM device according to another embodiment of the present disclosure.
Figure 6B:
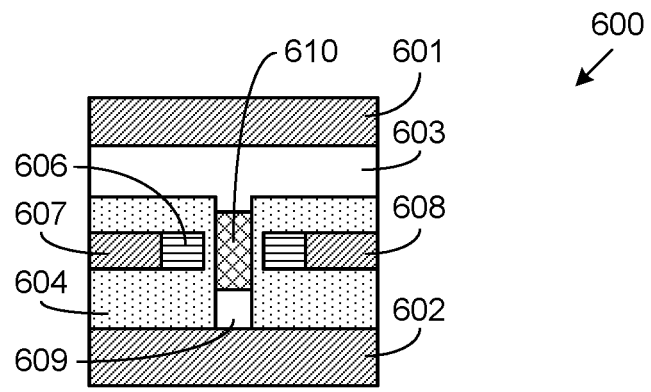

FIGS. 6A and 6B schematically show a structure of another example PCM device 600 in cross-sectional views, consistent with embodiments of the present disclosure. The PCM device 600 is similar to the PCM device 500 shown in FIG. 5 except for a position of a heater 606. In the PCM device 500, the heater 506 is adjacent to the bottom electrode 502, while in the PCM device 600, the heater 606 is disposed at a position away from a bottom electrode 602 by a given distance. Most of the structural and material features and variations of the embodiments described above in connection with FIG. 5 may be applied to the PCM device 600. As shown in FIG. 6, the PCM device 600 includes a top electrode 601, the bottom electrode 602, a memory layer 603, an isolation layer 604, a heater 606, and electrodes 607 and 608 coupled to the heater 606.

In some embodiments, the top electrode 601, the heater 606, and the electrodes 607 and 608 of the PCM device 600 are the same as or similar to the top electrode 501, the heater 506, and the electrodes 507 and 508 of the PCM device 500. For example, the isolation layer 604 is arranged between the memory layer 603 and the bottom electrode 602. The heater 606 is buried in the isolation layer 604 which includes one or more electrically insulating materials. The memory layer 603 can include a phase-change material such as one or more of the GST-based materials. The electrodes 507 and 508 are arranged at two opposite sides of the heater 506 and at positions between the top and bottom electrodes 501 and 502.

Similar to the memory layer 503 of the PCM device 500, the memory layer 603 of the PCM device 600 has a protrusion portion which is indicated by reference numeral 609 in FIG. 6A. The heater 606 can be used to heat a programming region 610 that is part of the protrusion portion 609 to change the phase of the programming region 610. The protrusion portion 609 may have a shape of a circular pillar, an oval pillar, a rectangular pillar, or a square pillar. A cross-section of the protrusion portion 609 may be smaller or much smaller than a cross-section of the memory layer 603 in a plane parallel to the memory layer 603. The heater 606 may have a ring shape or another shape, and may at least partially surround the programming region 610. The heater 606 may also be disposed close to the programming region 610 without surrounding the programming region 610. In some embodiments, a thin layer can be formed between the protrusion portion 609 and the bottom electrode 602 to, e.g., improve the quality of an interface between the protrusion portion 609 and the bottom electrode 602.

As shown in FIGS. 6A and 6B, the programming region 610 is arranged away from the bottom electrode 602 by a given distance. As such, the programming region 610 is away from the interface between the protrusion portion 609 and the bottom electrode 602 by the given distance, i.e., away from the interface between the phase-change material and a conductor by the given distance. Similarly, the programming region 610 is also disposed away from the interface between the memory layer 603 and the top electrode 601 by another distance. Thus, instead of the programming region 610, a part of the protrusion part 609 which is outside region 610 physically contacts a surface of the bottom electrode 602.

An example operation of the PCM device 600 is described below. Assume that the memory layer 603 is initially in the crystalline state with a low resistance. When a large electric current, e.g., a large electric current pulse, is applied to the heater 606 for a short time period, the programming region 610 is heated to a temperature above the melting temperature of the phase-change material. After the phase-change material in the programming region 610 is melted and then cooled down, the programming region 610 solidifies but into the amorphous state. That is, this heating-cooling process causes the programming region 610 to change from the crystalline state to the amorphous state. When a moderate electric current, e.g., a moderate electric current pulse, is applied to the heater 606 for a moderate time period, the programming region 610 is heated again to a temperature above the crystallization temperature of the phase-change material but lower than the melting temperature of the phase-change material. At this temperature, the programming region 610 may be recrystallized. That is, this heating process causes the programming region 610 to return to the crystalline state.

The programming region 610 and the remaining part of the memory layer 603 are electrically coupled to each other, and the resistance of the remaining part of the memory layer 603 may remain unchanged during the operation of the PCM device 600. As such, the change of resistance of the PCM device 600 can be determined by the change of resistance of the programming region 610, i.e., by the phase change of the programming region 610. Thus, the resistance of the PCM device 600 may be used to detect whether the programming region 610 is in the crystalline or the amorphous state and the phase change may be used for data storage.

According to the present disclosure, the heater 606 is powered via the electrodes 607 and 608. Therefore, even if voids are formed in the programming region 610 as a result of repeated expanding and shrinking of the programming region 610, the operation of the heater 606 is not affected because the heater 606 does not rely on the programming region 610 to receive an electric current.

When voids are formed in the programming region 610 that results in an open circuit or abnormally large resistance in a current path that passes through the programming region 610, the heater 606 can be used to repair the programming region 610 by heating the programming region 6109 in one or more cycles to eliminate the voids such that the current path that passes through the programming region 610 can be re-established.

Compared to aforementioned embodiments where a programming region is located at the interface between a conductor and a phase-change material, the programming region 610 is disposed away from the conductor-phase-change-material interface. The programming region 610 does not contact the interface between the protrusion portion 609 and the bottom electrode 602, and does not contact the interface between the memory layer 603 and the top electrode 602, either. As a conductor-phase-change-material interface is prone to void formation during the crystallization and re-crystallization processes, the void formation issues may be mitigated to a certain extent.

In some embodiments, the PCM device 400 may be operated via the top electrode 401, the bottom electrode 402, and the electrodes 407 and 408 in the same ways as the PCM devices 200 and 300 described in FIGS. 2 and 3. For example, the top electrode 401, the bottom electrode 402, and the electrodes 407 and 408 may be electrically connected to four separate terminals or connected to just two terminals.

In some embodiments, the PCM device 500 may be operated via the top electrode 501, the bottom electrode 502, and the electrodes 507 and 508 in the same ways as the PCM devices 200 and 300 described in FIGS. 2 and 3. For example, the top electrode 501, the bottom electrode 502, and the electrodes 507 and 508 may be electrically connected to four separate terminals or connected to just two terminals.

In some embodiments, the PCM devices 100, 400, 500, and 600 each may represent a design of a PCM cell. Such PCM cells may be used to build a two-dimensional (2D) or three-dimensional (3D) array for a 2D or 3D memory system.

Although the principles and implementations of the present disclosure are described by using specific embodiments in the specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of the specification should not be construed as a limitation to the present disclosure.

What is claimed is:

1. A phase-change memory device, comprising:
a first electrode and a second electrode;
a memory
layer under the first electrode and over the second electrode the memory layer comprising a programming region comprising a phase-change material;
an isolation layer sandwiched between the memory layer and the second electrode the isolation layer containing a conductor layer and a heater that are isolated from each other,
wherein:
the conductor layer and the heater are on a same side and under a bottommost surface of the memory layer,
the conductor layer connects the programming region with the second electrode and is configured as a main heater to heat the programming region for a phase-change process, and
the heater is in a proximal distance from the memory layer, and is configured as an auxiliary heater to heat the programming region for removing voids from the programming region of the memory layer.

2. The device according to claim 1, wherein
the programming region of the memory layer is deposited surrounding an end portion of the conductor layer, and
a remaining part of the memory layer is electrically coupled to the programming region and irresponsive to the phase-change process.

3. The device according to claim 1, further comprising:
a first terminal electrically coupled to the first electrode, and
a second terminal electrically coupled to the second electrode,
wherein a first current path passes through the first terminal, the first electrode, and the memory layer, the conductor layer, the second electrode, and the second terminal, for the phase-change process.

4. The device according to claim 3, further comprising:
a power source,
a third electrode electrically coupled to the heater,
a fourth electrode electrically coupled to the heater,
a third terminal electrically coupled to the third electrode, and
a fourth terminal electrically coupled to the fourth electrode, wherein a second current path passes through the power source, the third terminal, the third electrode, and the heater, the fourth electrode, and the fourth terminal, and the second current path is not passing through the memory layer.

5. The device according to claim 1, wherein cross-sectional areas of the heater and the conductor layer together are smaller than an entire surface area of the second electrode along a direction parallel to the memory layer.

6. The device according to claim 1, wherein the conductor layer includes a semiconductor material between the memory layer and the second electrode.

7. The device according to claim 1, wherein the heater surrounds the programming region of the memory layer at least partially.

8. The device according to claim 1, wherein the heater is used to repair the programming region by heating the programming region in one or more cycles to remove the voids such that an electric current path that passes through the conductor layer is re-established.

9. The device according to claim 1, wherein the heater includes a ring-shaped heating element.

10. The device according to claim 1, wherein the heater is electrically isolated from the first electrode and the second electrode.

11. The device according to claim 1, wherein a portion of the isolation layer separates the heater from the bottommost surface of the memory layer, and the heater is electrically isolated from the memory layer.

12. The device according to claim 1, wherein the programming region of the memory layer is arranged away from the first electrode and the second electrode.

13. The device according to claim 1, wherein the heater is coupled to a power source via an electric current path not passing through the memory layer.

14. The device according to claim 1, further comprising:
a third electrode and a fourth electrode arranged in the isolation layer and under the bottommost surface of the memory layer,
wherein the third electrode and the fourth electrode are electrically coupled to the heater at two opposite sides of the heater.

15. The device according to claim 1, wherein the heater comprises a metallic heating element, a plastic heating element, or a composite heating element.

16. The device according to claim 1, wherein the memory layer has a shape of a circular pillar, an oval pillar, a rectangular pillar, or a square pillar.

17. The device according to claim 1, wherein the programming region of the memory layer is separated from an interface between the memory layer and the first electrode by a non-programming region.

* * * * *